(12) United States Patent
Wutte et al.

(10) Patent No.: US 9,941,354 B2
(45) Date of Patent: Apr. 10, 2018

(54) SEMICONDUCTOR DEVICE COMPRISING A FIRST GATE TRENCH AND A SECOND GATE TRENCH

(71) Applicant: Infineon Technologies Austria AG, Villach (AT)

(72) Inventors: Britta Wutte, Feistritz (AT); Sylvain Leomant, Pörtschach am W. (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/374,254

(22) Filed: Dec. 9, 2016

(65) Prior Publication Data

US 2017/0170274 A1   Jun. 15, 2017

(30) Foreign Application Priority Data

Dec. 10, 2015   (DE) .................. 10 2015 121 497

(51) Int. Cl.
| | | |
|---|---|---|
| *H01L 29/74* | (2006.01) | |
| *H01L 27/148* | (2006.01) | |
| *H01L 29/80* | (2006.01) | |
| *H01L 27/108* | (2006.01) | |
| *H01L 21/336* | (2006.01) | |
| *H01L 21/331* | (2006.01) | |
| *H01L 29/06* | (2006.01) | |
| *H01L 29/40* | (2006.01) | |

(Continued)

(52) U.S. Cl.
CPC ........ *H01L 29/0696* (2013.01); *H01L 29/407* (2013.01); *H01L 29/4238* (2013.01); *H01L 29/7813* (2013.01); *H02M 3/158* (2013.01); *H01L 29/41766* (2013.01)

(58) Field of Classification Search
CPC .......... H01L 29/66348; H01L 29/7395; H01L 29/7397; H01L 27/0886; H01L 27/0924; H01L 27/10841; H01L 29/407; H01L 29/42356; H01L 29/66628; H01L 29/7813; H01L 21/76877; H01L 21/76879; H01L 21/823431; H01L 21/823487; H01L 21/823821; H01L 21/823885
USPC ........ 438/259, 270, 361; 257/135, 220, 263, 257/302, 330, 331
See application file for complete search history.

(56) References Cited

U.S. PATENT DOCUMENTS

| | | | |
|---|---|---|---|
| 8,022,474 B2 * | 9/2011 | Haeberlen | ........... H01L 29/7805 257/331 |
| 8,652,900 B2 | 2/2014 | Hsieh | |

(Continued)

FOREIGN PATENT DOCUMENTS

DE   102014117297 A1   5/2015

*Primary Examiner* — Hsien Ming Lee
(74) *Attorney, Agent, or Firm* — Murphy, Bilak & Homiller, PLLC

(57) ABSTRACT

A semiconductor device includes a first gate trench and a second gate trench in a first main surface of a semiconductor substrate. A mesa is arranged between the first gate trench and the second gate trench. The mesa separates the first gate trench from the second gate trench. Each of the first and second gate trenches includes first sections extending in a first direction and second sections connecting adjacent ones of the first sections. The second sections of the first gate trench are disposed opposite to the second sections of the second gate trench with respect to a plane perpendicular to the first direction.

20 Claims, 10 Drawing Sheets

(51) Int. Cl.
*H01L 29/78* (2006.01)
*H02M 3/158* (2006.01)
*H01L 29/423* (2006.01)
*H01L 29/417* (2006.01)

(56) References Cited

U.S. PATENT DOCUMENTS

| | | | |
|---|---|---|---|
| 8,928,066 B2 * | 1/2015 | Wutte | H01L 29/407 257/328 |
| 9,385,228 B2 | 7/2016 | Laven et al. | |
| 2009/0008709 A1 | 1/2009 | Yedinak et al. | |
| 2011/0233665 A1 | 9/2011 | Matsuura et al. | |

* cited by examiner

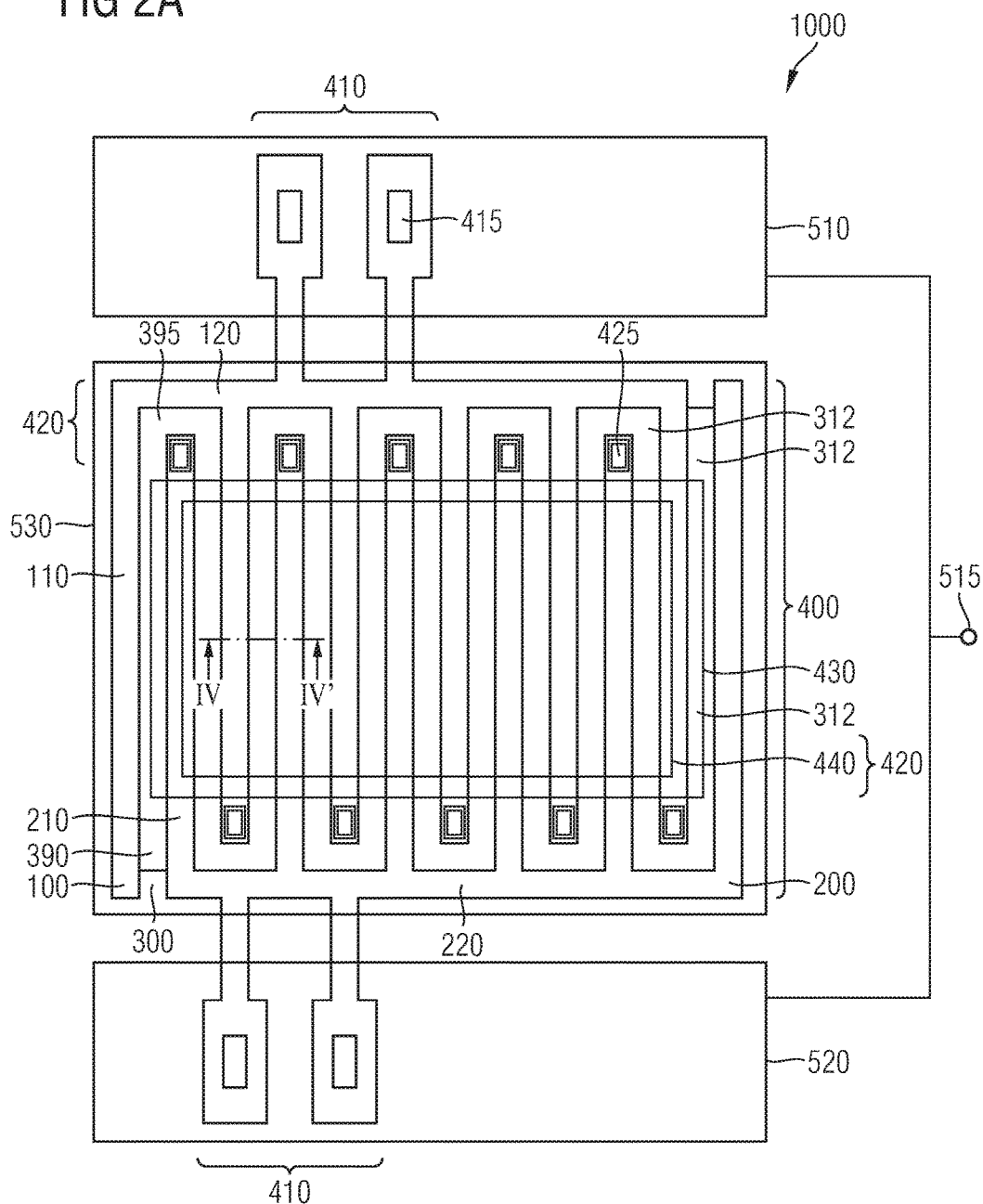

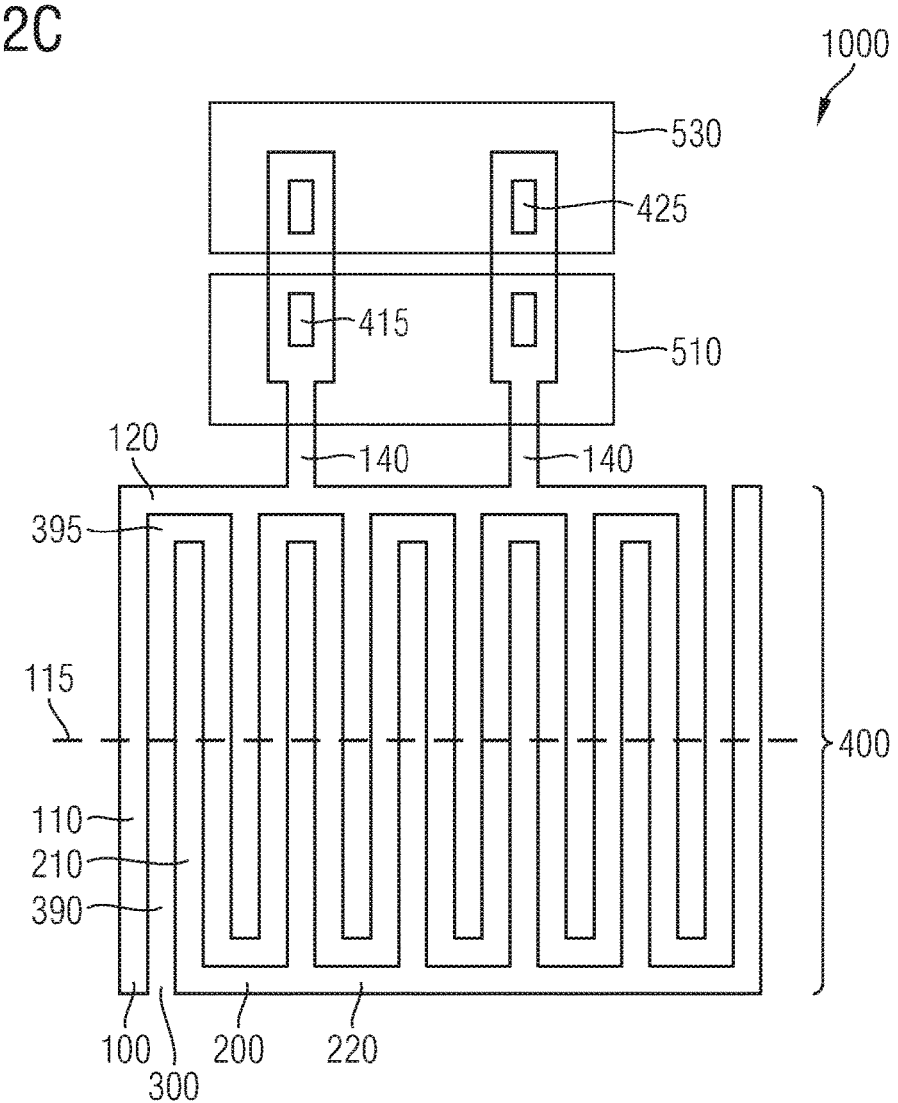

SEMICONDUCTOR DEVICE COMPRISING A FIRST GATE TRENCH AND A SECOND GATE TRENCH

BACKGROUND

Power transistors are commonly employed in automotive and industrial electronics as switches. Generally, such transistors require a low on-state resistance ($R_{on} \cdot A$), while securing a high voltage blocking capability. For example, a MOS (metal oxide semiconductor) power transistor should be capable—depending upon application requirements—to block drain to source voltages $V_{ds}$ of some tens to some hundreds or even thousands of volts. MOS power transistors typically conduct a very large current which may be up to some hundreds of Amperes at typically gate-source voltages of about 2 to 20 V.

In trench power devices, components of the transistors such as the gate electrode are typically disposed in trench structures formed in a main surface of a semiconductor substrate. Such trench power devices typically implement vertical transistors in which a current flow mainly takes place from a first side, e.g. a top surface of the semiconductor substrate to a second side, e.g. a bottom surface of the semiconductor substrate. Charge balanced shielded gate trench MOSFETs (metal oxide semiconductor field effect transistors) are, e.g. used for several DC/DC power conversion applications. In particular, power MOSFETs based on this technology allow to reach a high efficiency by optimizing both conduction and switching losses coming from the power MOSFET itself.

Further investigations are being made for improving trench power MOSFETs.

SUMMARY

According to an embodiment, a semiconductor device comprises a first gate trench and a second gate trench in a first main surface of a semiconductor substrate. A mesa is arranged between the first gate trench and the second gate trench, the mesa separating the first gate trench from the second gate trench. Each of the first and second gate trenches comprises first sections extending in a first direction and second sections connecting adjacent ones of the first sections. The second sections of the first gate trench are disposed opposite to the second sections of the second gate trench with respect to a plane perpendicular to the first direction.

According to a further embodiment, a semiconductor device comprises a first gate trench and a second gate trench in a first main surface of a semiconductor substrate. A mesa is arranged between the first gate trench and the second gate trench and separates the first gate trench from the second gate trench. Each of the first and second gate trenches comprises first sections extending in a first direction and second sections connecting adjacent ones of the first sections. The first sections of the first gate trench are disposed between adjacent ones of the first sections of the second gate trench and vice versa.

According to an embodiment, a semiconductor device comprises a first gate trench and a second gate trench in a first main surface of a semiconductor substrate. A mesa is arranged between the first gate trench and the second gate trench and separates the first gate trench from the second gate trench. The mesa comprises first regions extending in first direction and second regions connecting adjacent ones of the first regions. The mesa is implemented as a path.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 2A shows a schematic plan view of a semiconductor device according to an embodiment.

FIG. 2C shows a schematic horizontal cross-sectional view of a semiconductor device according to one or more embodiments.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Figure 1:
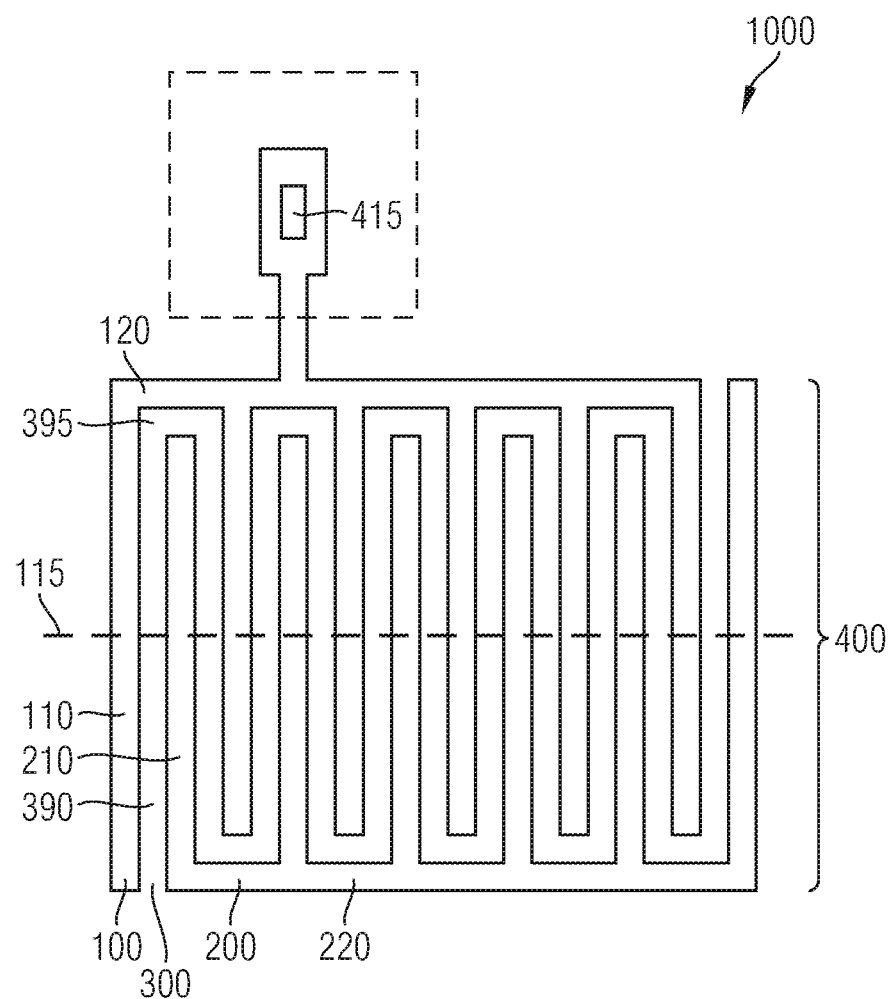
FIG. 1 shows a schematic horizontal cross-sectional view of a semiconductor device according to an embodiment.

FIG. 1 shows a horizontal cross-sectional view of a semiconductor device 1000 according to an embodiment. The horizontal cross-sectional view taken in a plane parallel to a first main surface of a semiconductor substrate. The semiconductor device 1000 comprises a first gate trench 100 and second gate trench 200 in the first main surface of a semiconductor substrate. A mesa 300 is arranged between the first gate trench 100 and the second gate trench 200, the mesa 300 separating the first gate trench 300 from the second gate trench 200. The first gate trench 100 comprises first sections 110 extending in a first direction, e.g. the y-direction and second sections 120 connecting adjacent ones of the first sections 110. The second gate trench 200 comprises first sections 210 extending in the first direction, e.g. the y-direction, and second sections 220 connecting adjacent ones of the first sections 210. The second sections 120 of the first gate trench 100 are disposed opposite to the second sections 220 of the second gate trench 200 with respect to a plane 115 perpendicular to the first direction. For example, the plane 115 may run in a second direction, e.g. the x-direction and may be perpendicular to first main surface of the semiconductor substrate.

As is specifically illustrated in FIG. 1, the first gate trench 100 is separated from the second gate trench 200, i.e. the first gate trench 100 is not connected with the second gate trench 200. In other words, the first sections 110 of the first gate trench 100 are not structurally connected with any of the first sections 210 of the second gate trench 200 or the second sections 220 of the second gate trench 200. Further, the second sections 120 are not structurally connected with any of the first sections 210 of the second gate trench 200 or the second sections 220 of the second gate trench 200. The first and the second gate trenches 100, 200 may be identical in shape or at least a part of the first gate trench 100 and the second gate trench 200 may be identical to each other. The second gate trench 200 may be rotated by 180° in a plane parallel to the first main surface of the semiconductor substrate. The first sections 110 of the first gate trench 100 may be identical with the first sections 210 of the second gate trench 200. The second sections 120 of the first gate trench 100 may be identical with the second sections 220 of the second gate trench 200.

The second sections 120 of the first trench 100 connect adjacent ones of the first sections 110 of the first trench 100. The second sections 220 of the second gate trench 200 connect adjacent ones of the first sections 210 of the second gate trench 200. The second sections 120, 220 may run in a second direction which is perpendicular to the first direction. The second direction may for example be the x-direction. Further, the second sections may have a curved shape. According to further embodiments, the second sections may comprise a straight or linear portion, e.g. linearly extending in the second direction and may have a curved or slanted connection portion to the first sections 110. The first gate trench 100 and the second gate trench 200 are separated from each by means of the mesa 300.

According to an alternative interpretation, the semiconductor device 1000 may comprise a first gate trench 100 and a second gate trench 200 in a first main surface of semiconductor substrate. A mesa 300 is arranged between the first gate trench 100 and the second gate trench 200 and separates the first gate trench 100 from the second gate trench 200. The first gate trench 100 comprises first sections 110 extending in a first direction, e.g. the y-direction and second sections 120 connecting adjacent ones of the first sections 110. The second gate trench 200 comprises first sections 210 extending in the first direction and second sections 220 connecting adjacent ones of the first sections 210. The first sections 110 of the first gate trench 100 are disposed between adjacent ones of the first sections 210 of the second gate trench 200 and vice versa. The first sections 110 of the first gate trench 100 may be parallel to the first sections 210 of the second gate trench 200. As has been discussed above, the second gate trench 200 may be identical to the first gate trench or may have sections which are identical to those of the first gate trench. The second gate trench 200 may be or rotated by 180° in a plane parallel to the first main surface.

For example, the first gate trench 100 and the second gate trench 200 may have a comb-like structure, wherein the first sections 110, 210 correspond to the teeth of the comb whereas the concatenation of second sections 120, 220 corresponds to the shaft of the comb. The first comb implementing the first gate trench 100 and the second comb implementing the second gate trench 200 are inserted into each other or assembled in such a manner that the shaft and outer teeth of the first gate trench and of the second gate trench form the outer contour of the arrangement of first gate trench 100 and second gate trench 200.

The arrangement of the first gate trench 100 and the second gate trench 200 forms a pattern of interdigitated fingers, wherein the transistor cells of the transistor are disposed between the single fingers of the first gate trench 100 and the second gate trench 200.

The mesa 300 separates the first gate trench 100 and the second gate trench 200 from each other. The mesa 300 may be regarded as comprising first regions 390 extending in the first direction and second regions 395 connecting adjacent first regions 390. The mesa 300 is implemented as a path. In the context of the present specification, the term "path" is to be understood as being different from a loop which means that the path has an initial point which is different from a terminal point. In contrast, a loop has an initial point which may be equal to the terminal point of the loop. The mesa 300 forms kind of meander in the first main surface of the semiconductor substrate and continuously extends across the cell array. The first regions 390 may run in the y-direction. The second regions 395 that connect adjacent ones of the first regions 390 may run in the direction which is perpendicular to the first direction, e.g. into the x-direction. According to a further embodiment, the second regions 395 may be curved or slanted or may comprise straight portions and rounded portions. For example, the mesa may have a shape so that a width of the mesa is approximately equal throughout its length.

FIG. 1 further shows a gate contact 415. The gate contact 415 is disposed in a peripheral portion of the semiconductor device 1000. Generally, the semiconductor device 1000 comprises a transistor cell array 400 and a peripheral portion outside the transistor cell array 400. The first gate trench 100 and the second gate trench 200 are assembled so that the outermost first section of the first and second gate trenches 100, 200 and the concatenation of second sections of the first and second gate trenches 100, 200 forms an outer contour of the transistor cell array 400. The gate contact 415 may be arranged outside the cell array 400 and outside the contour formed by the combined first gate trench 100 and second gate trench 200. The gate contact 415 electrically connects the gate electrode to a gate terminal via a gate conductive layer, e.g. a gate metallization layer, as will be explained below.

According to one or more embodiments, the first sections 110 of the first gate trench 100 are disposed at a first pitch, and the first sections 210 of the second gate trench 200 may be disposed at the first pitch. Further, sections 390 of the mesa 300 may be disposed at a second pitch. The sections 390 of the mesa 300 extend in the first direction, e.g. the y-direction. The sections of the mesa separate the first sections 110 of the first trench from the first sections 210 of the second trench. The second pitch may be equal to half the first pitch.

FIG. 2A shows schematic plan view of the semiconductor device 1000. The semiconductor device 1000 comprises a first gate trench 100 and a second gate trench 200 which may have the same shape and structure as illustrated in FIG. 1. The semiconductor device further comprises a mesa 300 arranged between the first gate trench 100 and the second gate trench 200. The mesa 300 has a shape as has been discussed with reference to FIG. 1. FIG. 2A further shows gate contact areas 410 that are disposed in a peripheral area outside the cell array 400 which is defined by the first gate trench 100 and the second to trench 200. Gate contacts 415 are disposed in the gate contact area 410. FIG. 2A further shows schematically gate conductive layer portions 510, 520 which are disposed outside the cell array 400. According to an embodiment, the first gate conductive layer portion 510 and the second gate conductive layer portion 520 may be connected to a common gate terminal 515.

As is further illustrated in FIG. 2A, a field plate contact area 420 may be disposed at an end portion of the first sections 110, 210. The end portions of the first sections 110 of the first gate trench are arranged remote from the second sections 120 of the first gate trench. Likewise, the end portions of the first sections 210 of the second gate trench are arranged remote from the second sections 220 of the second gate trench 200. The end portions of the first sections 110 of the first gate trench 100 are facing the second sections 220 of the second gate trench. The end portions of the first sections 210 of the second gate trench 200 are facing the second sections 120 of the first gate trench 100. As will be explained in more detail with reference to the following Figures, the field plate contacts 425 are formed at these end portions.

The mesa portions surrounding the end portions of the first sections 110, 210 are also referred to as "inactive mesa portions" 312. In more detail, as will be also explained with reference to the following Figures, source regions are not formed in these inactive mesa portions 312. Accordingly, no vertical transistor cell is formed in these inactive mesa portions 312. In particular, the inactive mesa portions are adjacent to the second sections 120, 220. Further, in a general transistor cell array comprising a plurality of vertical transistor cells which will be explained with reference of FIG. 2B, the outermost first regions 390 of the mesa 300 form inactive mesa portions 312. In more detail, no source regions are formed in the inactive mesa portions 312.

FIG. 2A schematically shows a boundary of a source implantation mask 440. In more detail, while performing a doping process, e.g. an ion implantation process for defining the source regions, only the inner portion of the mask 440 is uncovered, whereas the area outside the boundary of the mask 440 is covered. As a result, dopants are only introduced into the first regions 390 of the mesa 300 within the boundary of the mask 440.

FIG. 2A further shows a boundary of a gate dielectric mask 430. The portion within the boundary of the gate dielectric mask 430 is uncovered, whereas the region outside the boundary of the gate dielectric mask 430 is covered during an etching step. During this etching step, a field dielectric layer is removed from an upper portion of a sidewall of the first and second gate trenches 100, 200 at portions inside the boundary of the gate dielectric mask 430, whereas the field dielectric layer remains up to the first main surface of the semiconductor substrate in the area outside the boundary of the gate dielectric mask 430. In later processing steps, a gate dielectric layer will be formed in those portions of the first and second gate trenches 100, 200, from which the field dielectric layer has been removed.

FIG. 2A further shows a contour of a source conductive layer 530, e.g. a source metallization layer, which is connected to the source regions of the single transistor cells and the field plate contacts 425. The source conductive layer 530 may be arranged over the semiconductor substrate. This will be explained in more detail below.

Figure 2B:
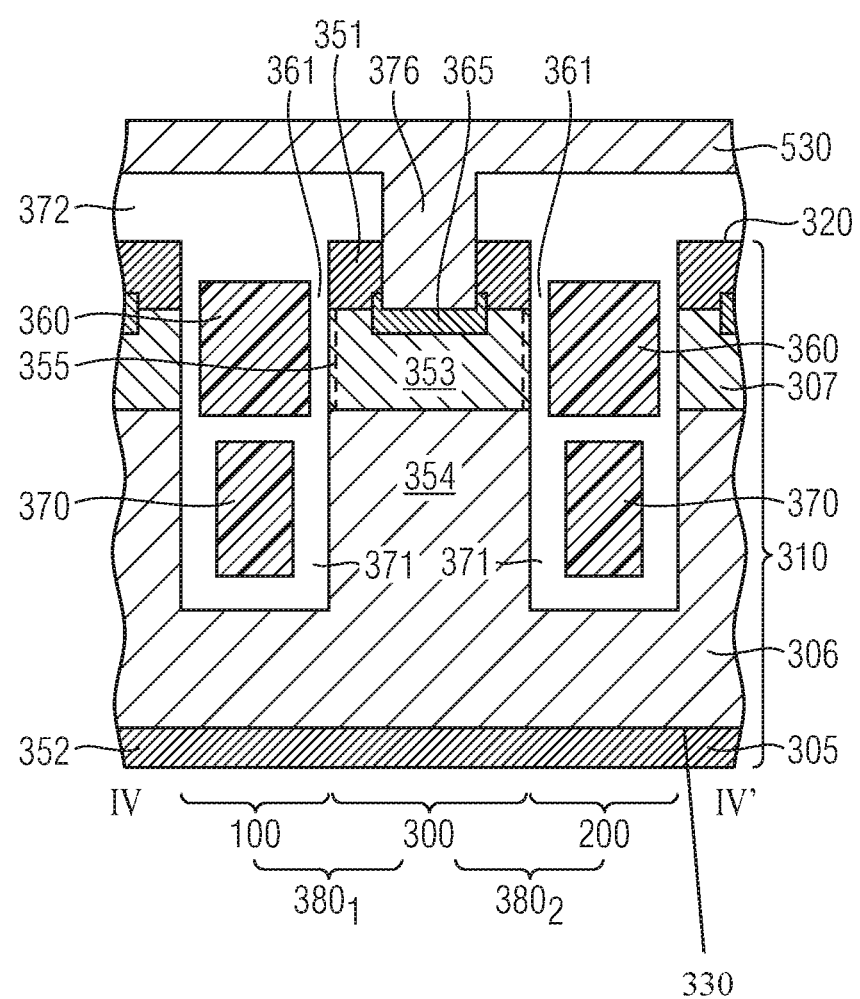
FIG. 2B shows a schematic cross-sectional view of a portion of the semiconductor device shown in FIG. 2A.

FIG. 2B shows a schematic cross-sectional view of two transistor cells $380_1$, $380_2$ between IV and IV', as is also indicated in FIG. 2A. The transistor cells $380_1$, $380_2$ are formed in a semiconductor substrate 310. For example, the semiconductor substrate 310 may comprise a base layer 305 of the first conductivity type. For example, the base layer 305 may be doped with n-type dopants at a high doping level to form a drain region 352 of the transistor. The semiconductor substrate 310 may further comprise an epitaxially or differently formed semiconductor layer 306 of the first conductivity type. A doped portion 307 of the second conductivity type may be disposed over the first layer 306. A first gate trench 100 and a second gate trench 200 are disposed in the first main surface 320 of the semiconductor substrate 310. A mesa 300 is defined between the first gate trench 100 and the second gate trench 200. A source region 351 is disposed adjacent to the first main surface 320 of the semiconductor substrate 310. For example, the source region may be of the first conductivity type. The doped portion 307 of the second conductivity type forms the body portion of the transistor cells $380_1$, $380_2$. The first layer 306 of the first conductivity type forms the drift zone 354 of the transistor cells $380_1$, $380_2$. The base layer 305 may form the drain region of the transistor. A gate electrode 360 may be disposed in the first and the second gate trench 100, 200 adjacent to the body region 353. The gate electrode 360 may be insulated from the body region 353 by means of a gate dielectric layer 361. A field plate 370 may be disposed in a lower portion of the first gate trench 100 and of the second gate trench 200. The field plate 370 may be insulated from the gate electrode 360. Further, the field plate 370 may be insulated from the adjacent semiconductor material 354 by means of the field dielectric layer 371. The source region 351 is electrically connected to the source conductive layer 530. Further, the body region 353 is connected to the source conductive layer 530 via a body contact portion 365. Due to the presence of this body contact portion 365, a bipolar parasitic transistor may be deteriorated or suppressed which could otherwise be formed in this portion. Generally, a power transistor comprises a plurality of single transistor cells $380_1, \ldots 380_n$ which are connected in parallel. For example, the single transistor cells $380_1, \ldots 380_n$ may comprise common components such as a common drain region.

When the transistor is switched on, e.g. by applying a corresponding voltage to the gate electrode 360, a conductive inversion layer (conductive channel) 355 is formed at the boundary between the body region 353 and the gate dielectric layer 361. Accordingly, the transistor is in a conductive state from the source region 351 to the drain region 352 via the drift zone 354. In case of switching-off, charges within the drift zone 354 are further depleted due to the presence of the field plate 370. Accordingly, a blocking of the current flow may be achieved. As has been explained above, due to the special structure of the first gate trench 100 and the second gate trench 200, the mesa is implemented as a path continuously extending along the cell array 400. As a result, the volume of the drift zone 354 adjacent to the field plate 370 does not substantially vary. As a consequence, overcompensation of the device may be avoided and the device characteristics may be improved.

Returning to the plan view of FIG. 2A, the semiconductor device 1000 comprises a plurality of vertical transistor cells $380_1, \ldots, 380_n$ in the manner as has been explained with reference to FIG. 2B. The source regions 351 of the vertical transistor cells are arranged at the first main surface 320, and the drain region 352 of the transistor is arranged at a second main surface 330 opposite the first main surface 320. The source regions 351 are arranged adjacent to the first sections 110, 210 of the first and second gate trenches 100, 200. The source regions 351 are absent from the second sections 120, 220. Accordingly, active mesa portions may be formed only at first sections 110, 210 of the first and second gate trenches 100, 200. Active mesa portions may be formed in the first regions 390 of the mesa.

Figure 2D:
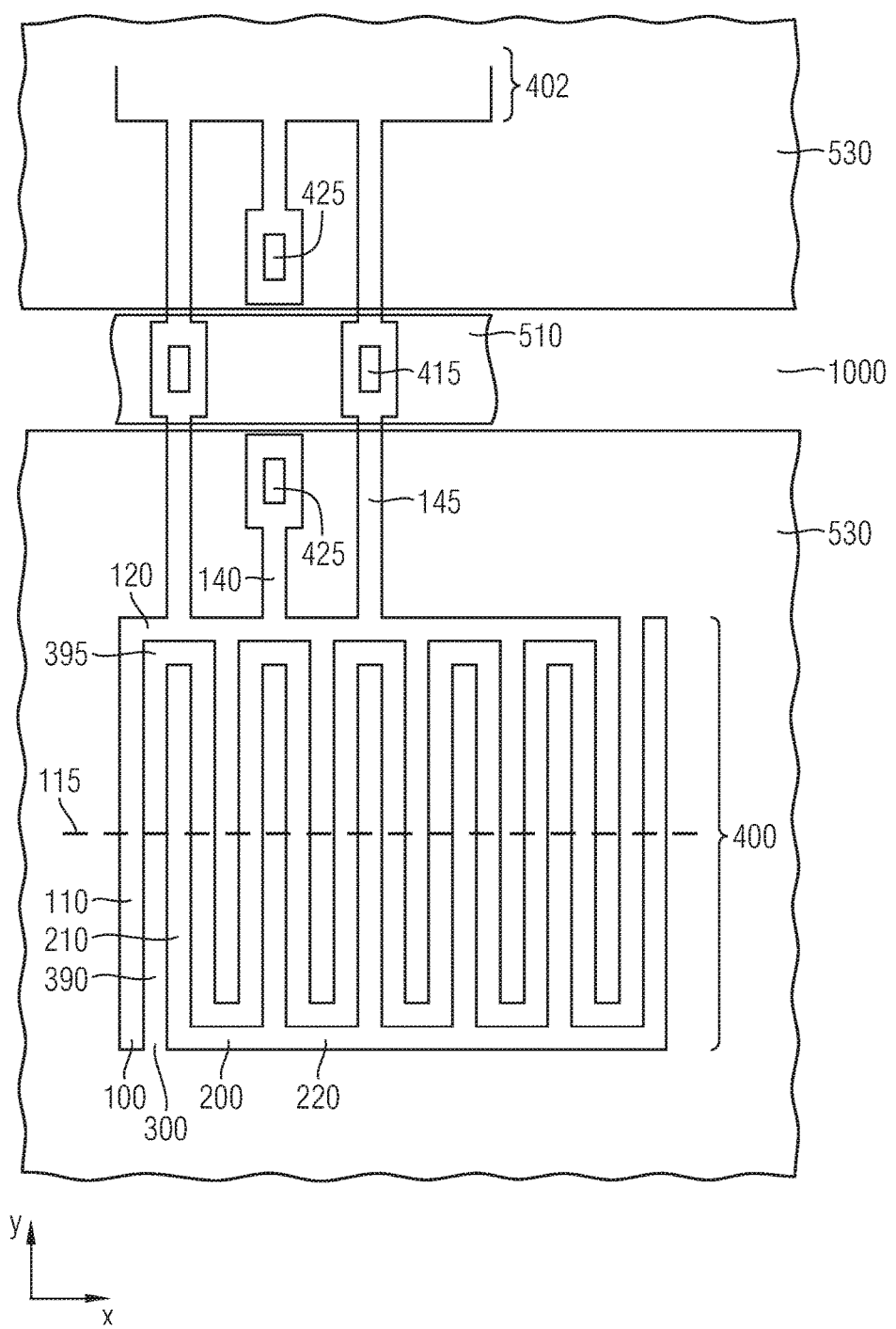
FIG. 2D shows a schematic horizontal cross-sectional view of a semiconductor device according to one or more embodiments.

FIGS. 2C and 2D illustrate embodiments according to which field plate contacts 425 may be arranged outside the transistor cell array 400.

According to the embodiment of FIG. 2C, gate contact trenches 140 may extend outside the transistor cell array 400. The gate contact trenches 140 may be connected with the first gate trench 100 and the second gate trench 200. Gate contacts 415 may be arranged in the gate contact trenches 140. The gate contacts 415 may electrically connect the gate electrode 360 within the gate trench 100, 200 with a gate terminal, e.g. via a gate conductive layer 510. Further, a field plate contact 425 may be arranged in the gate contact trenches 140. The field plate contact 425 may electrically connect the field plate 370 within the gate trench 100, 200 with a source terminal, e.g. via a source conductive layer 530. The mesa 300 may have a constant width which does not vary. The gate contacts 415 and the field plate contacts 425 may have a width that is larger than a width of the mesa 300.

According to the embodiment of FIG. 2D, gate contact trenches 140 may extend outside the transistor cell array 400. The gate contact trenches 140 may be connected with the first gate trench 100 and the second gate trench 200. Gate contacts 415 may be arranged in the gate contact trenches 140. The gate contacts 415 may electrically connect the gate electrode 360 within the gate trench 100, 200 with a gate terminal, e.g. via a gate conductive layer 510. Further, a field plate contact 425 may be arranged in a field plate contact trench 145 that is connected with the first gate trench 100 and the second gate trench 200. The field plate contact trench 145 may be disconnected from the gate contact trench 140. The field plate contact 425 may electrically connect the field plate 370 within the gate trench 100, 200 with a source terminal, e.g. via a source conductive layer 530. The mesa 300 may have a constant width which does not vary. The gate contacts 415 and the field plate contacts 425 may have a width that is larger than a width of the mesa 300. FIG. 2D shows a further transistor cell array 402 that is shifted along the y-direction with respect to the transistor cell array 400. The further transistor cell array 402 and the transistor cell array 400 may share common field plate contacts 425.

Figure 3:
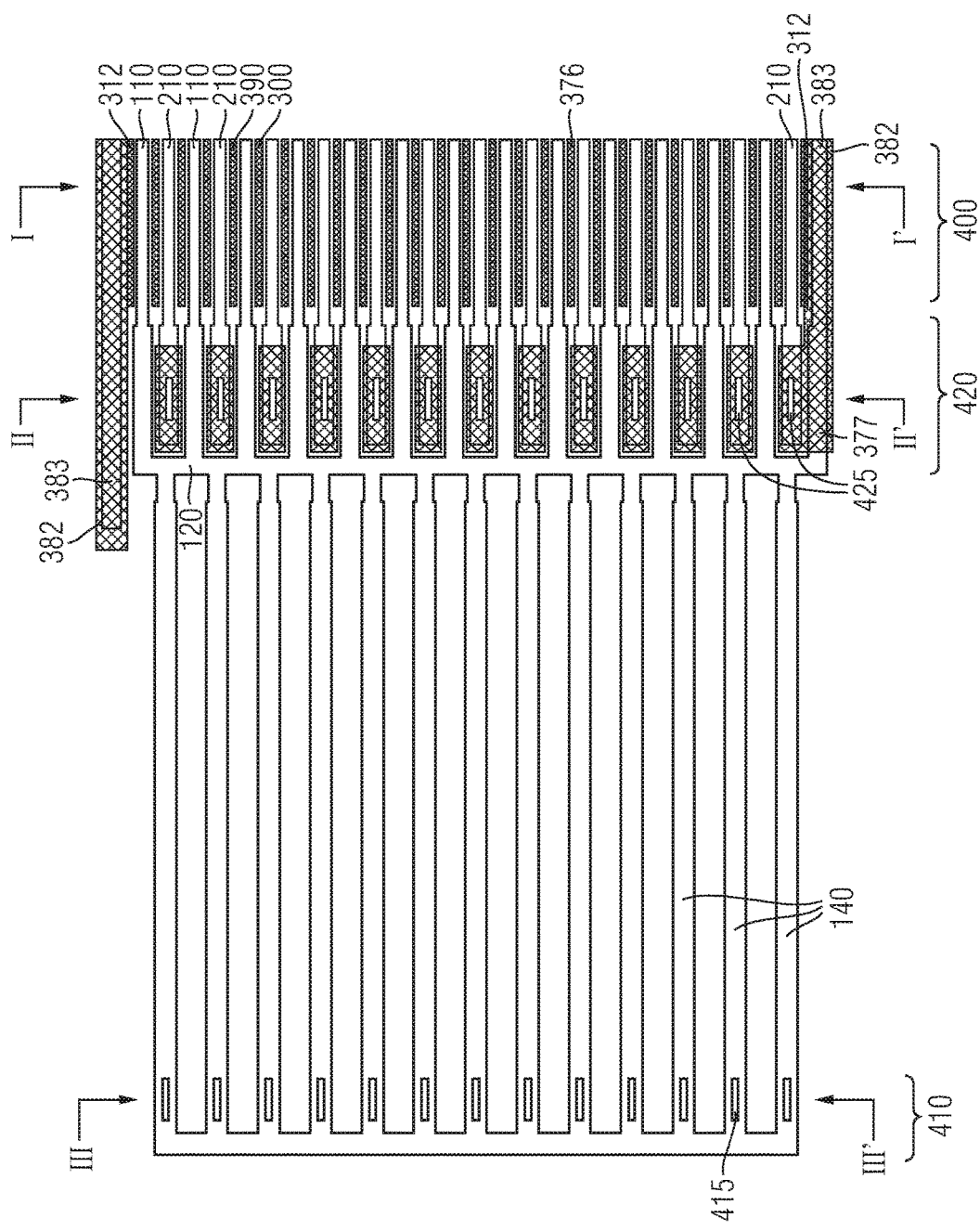
FIG. 3 shows a schematic horizontal cross-sectional view of a semiconductor device according to an embodiment.

FIG. 3 shows a horizontal cross-sectional view of a semiconductor device according to an embodiment. The horizontal cross-sectional view is taken in a region of the cell array 400, the field plate contact area 420 and the gate contact area 410. As is shown in FIG. 3, the cell array 400 comprises a plurality of alternating first sections 110 of the first gate trench 100 and first sections 210 of the second gate trench 200. The mesa comprises an inactive mesa portion 312 adjacent to the outermost first section 110 of the first gate trench 100. Further, an inactive mesa portion 312 is disposed adjacent to the outermost first section 210 of the second gate trench 200. The specific structure of the inactive mesa 312 will be explained below in more detail. Reference numeral 377 denotes a mask which is used for defining a gate electrode within the first gate trench 100 and the second gate trench 200. In more detail, when forming the transistor, first, a dielectric layer lining the sidewalls of the first and second gate trenches 100, 200 is formed, followed by forming a conductive filling. For forming the gate electrode, the conductive filling is removed from an upper portion of the first and second gate trenches 100, 200. No gate electrode is formed in a portion masked by the mask 377. These portions will form the inactive mesa portions 312.

Gate contact trenches 140 are arranged in contact with the first gate trench 100. The gate contacts 415 are formed in the gate contact trenches 140. As becomes apparent from FIG. 3, a pitch of the gate contact trenches 140 is larger than a pitch of the first sections 110, 210 of the first gate trench 100 or the second gate trench 200. As a result, gate contacts to the gate contact trenches may be formed more easily. First regions 390 of the mesa 300 are disposed between adjacent ones of the first sections 110 of the first gate trench 100 and the first sections 210 of the second gate trench 200. As can further be taken from FIG. 3, the end portions of the first sections may have a larger width than the remaining part of the first sections 110, 210, the width being measured perpendicularly with respect to the first direction. According to further embodiments, the width of the end portions of the first sections need not be larger than a width of the remaining part of the first sections 110, 210. Reference numeral 376 denotes source contacts which will be described in more detail below.

Figure 4A:
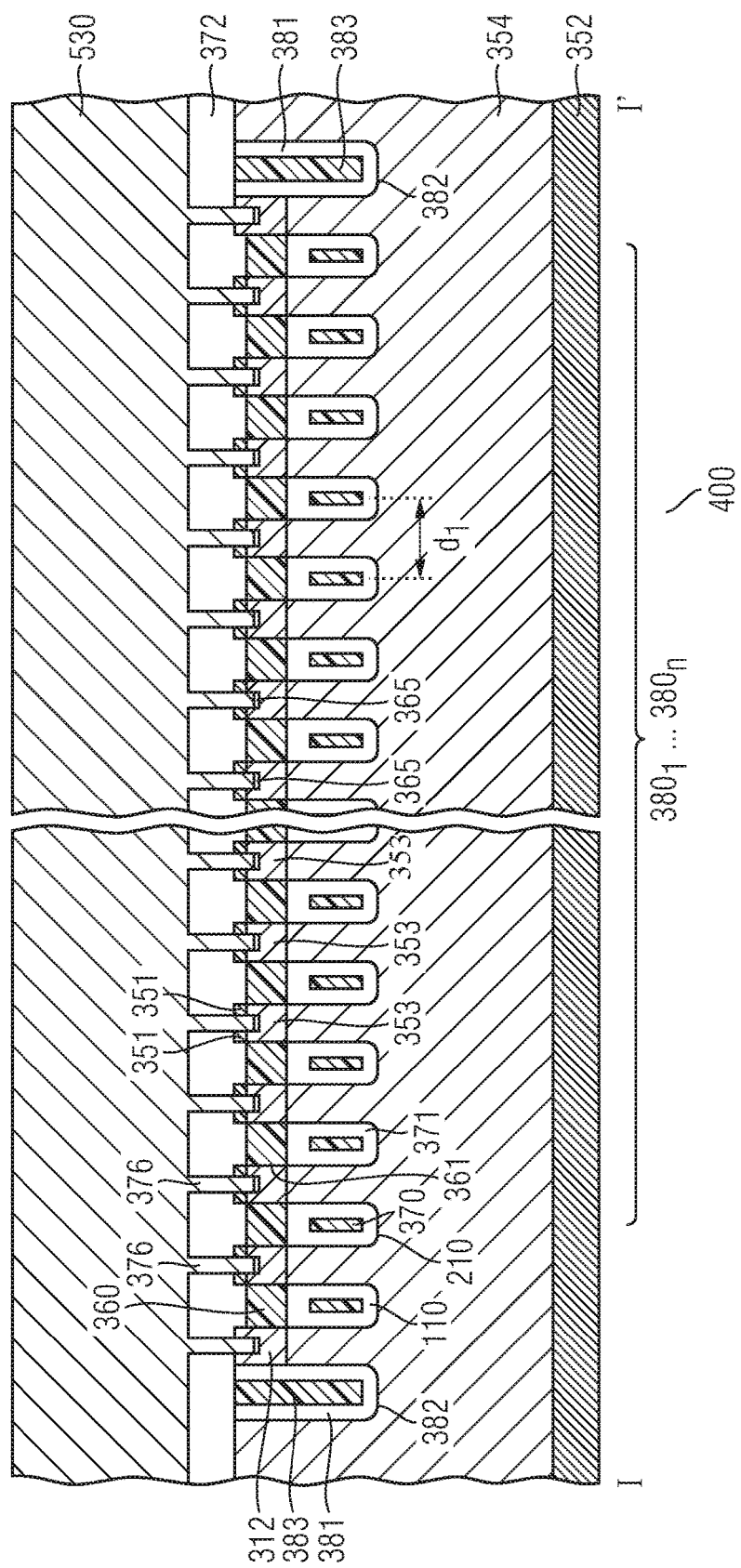
FIG. 4A shows a cross-sectional view of a portion of the semiconductor device shown in FIG. 3.

FIG. 4A shows a cross-sectional view of the semiconductor device shown in FIGS. 1 and 3. The cross-sectional view of FIG. 4A is taken in the cell array between I and I', as can also be taken from FIG. 3. The cross-sectional view intersects a plurality of transistor cells $380_1, \ldots 380_n$. The transistor cells may have a construction as has been explained above with reference to FIG. 2B. Accordingly, the transistor cell array comprises a plurality of first sections 110 of the first gate trench 100 and of first sections 210 of the second gate trench 200. The first sections 110 of the first gate trench 100 and the first sections 210 of the second gate trench 200 are alternatingly disposed. An inactive trench 382 is disposed at a boundary of the array of first sections 110, 210. The inactive trench 382 is filled with a conductive material 383. The conductive material is insulated from adjacent semiconductor material by means of the field dielectric layer 381. As has been explained with reference to FIG. 2A, due to the shape of the gate dielectric mask 430, the field dielectric layer 381 is not removed from the inactive trench 382. The semiconductor portion adjacent to the inactive trench 382 forms the inactive mesa portion 312 in which no source region is formed. A source conductive layer 530 is disposed over the transistor cell array 400. The source conductive layer 530 is electrically connected to the source regions 351 of the single transistor cells $380_1, \ldots, 380_n$ by means of source contacts 376. An insulating layer 372 is disposed between the semiconductor substrate and the source conductive layer 530. The first sections 110, 210 are disposed at a distance $d_1$.

Figure 4B:
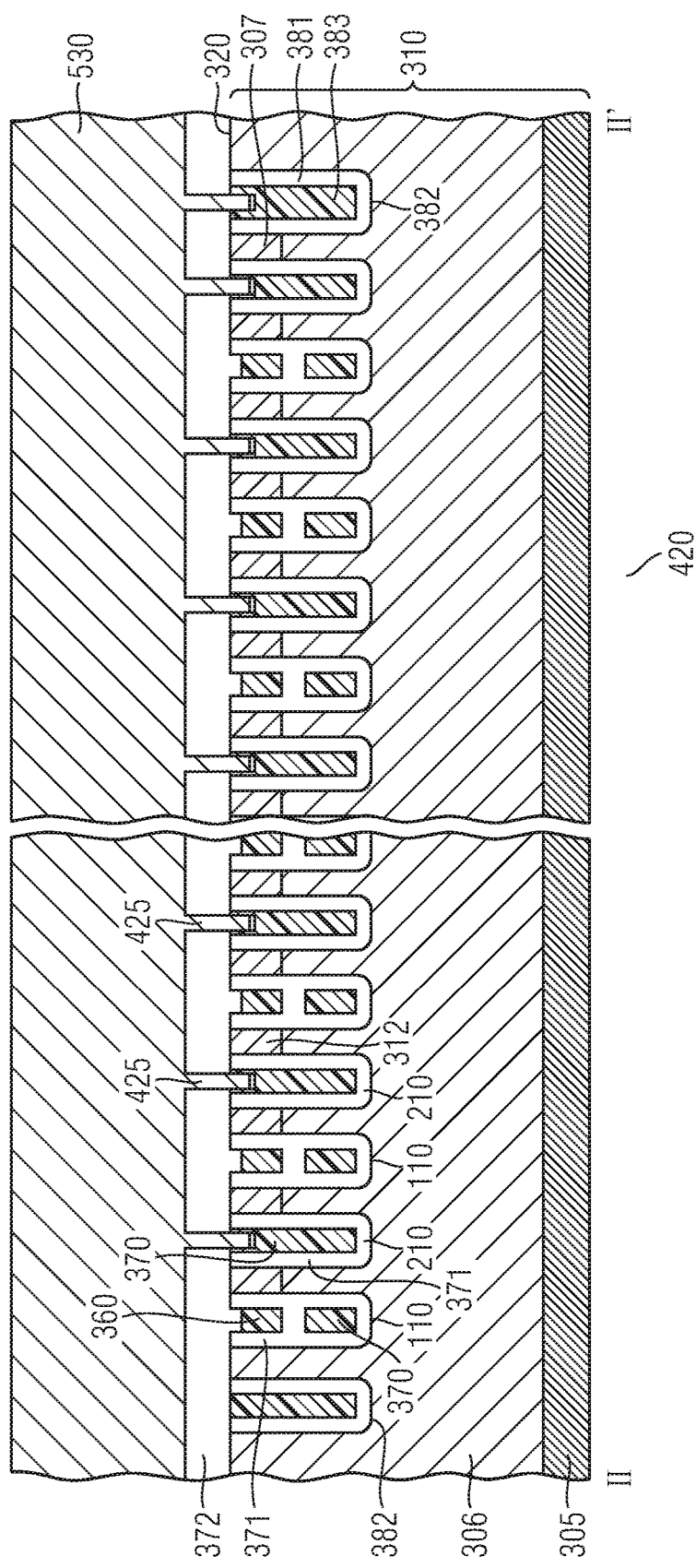
FIG. 4B shows a cross-sectional view of the field plate contact area of the semiconductor device shown in FIG. 3.

FIG. 4B shows a cross-sectional view of the semiconductor device in the field plate contact area 420. The cross-sectional view of FIG. 4B is taken between II and II', as is also illustrated in FIG. 3. The semiconductor substrate 310 comprises the base layer 305 and the first layer 306 of the first conductivity type. A doped portion 307 is disposed adjacent to the first main surface 320 of the semiconductor substrate 310. No source regions 351 are disposed adjacent to the end portion of the first sections 110, 210 of the first and second gate trenches 100, 200, respectively. Accordingly, an inactive mesa portion 312 is disposed between the first sections 110 of the first gate trench and the first sections 210 of the second gate trench. In the field plate contact area 420, the first sections 210 of the second gate trench 200 are formed in such a manner that the field plate 370 is disposed adjacent to the first main surface 320 of the semiconductor substrate. Field plate contacts 425 are arranged so as to electrically connect the field plates 370 in the second gate trench 200 with the source conductive layer 530. Moreover, the conductive material 383 of the inactive trench 382 at the edge of the array is electrically connected to the source conductive layer 530.

Figure 4C:
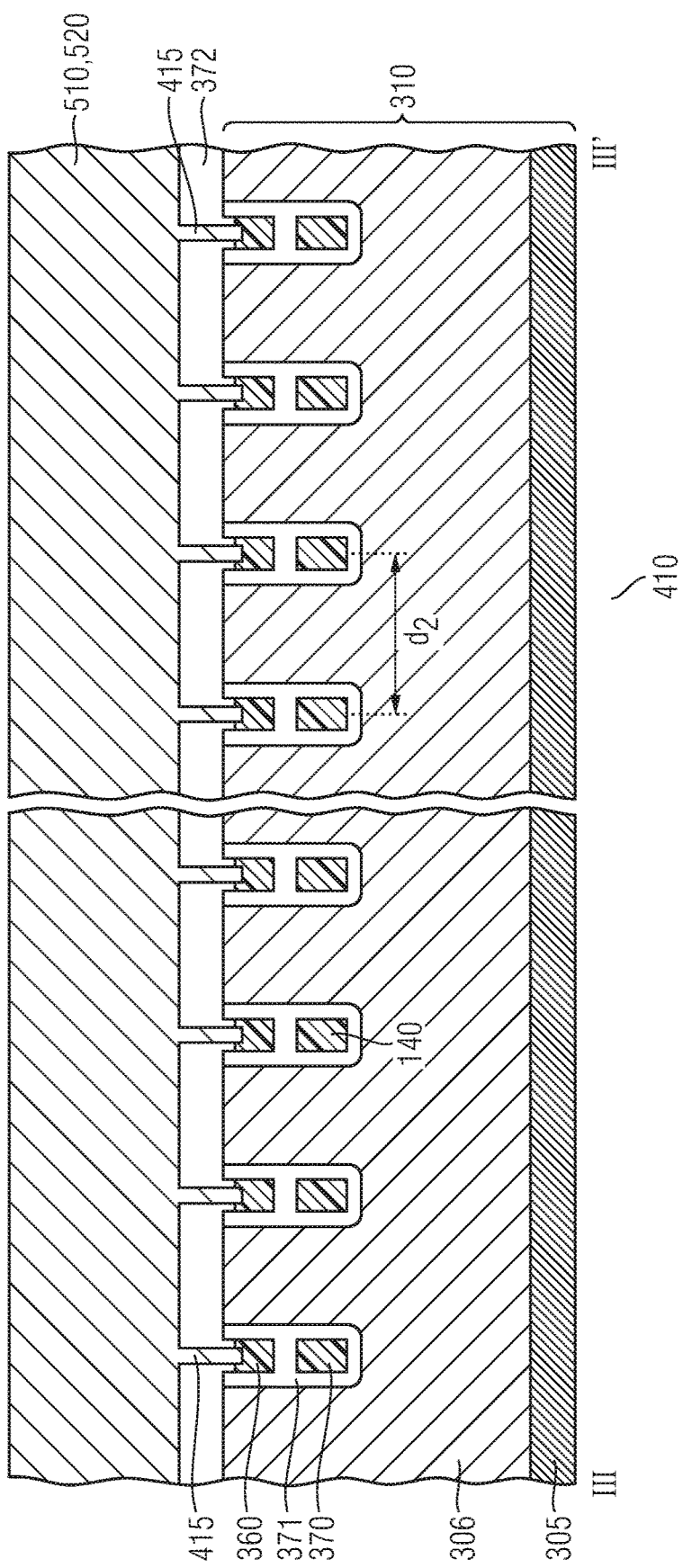
FIG. 4C shows a cross-sectional view of the gate contact area of the semiconductor device shown in FIG. 3.

FIG. 4C shows a cross-sectional view of the gate contact area 410. The cross-sectional view of FIG. 4C is taken between III and III', as is also illustrated in FIG. 3. FIG. 4C shows a plurality of gate contact trenches 140 that are disposed at a distance $d_2$. The distance $d_2$ may be larger than the distance $d_1$ between the first sections 110 of the first gate trench 100 and the first sections 210 of the second gate trench 200. The field plate 370 and the gate electrode 360 may be disposed in the gate contact trenches 140. The field plate 370 and the gate electrode 360 are insulated by means of a field dielectric layer 371 from the adjacent semiconductor material. The gate electrode 360 of each of the gate contact trenches 140 is electrically connected to the gate conductive layer 510, 520 by means of a gate contact 415. An insulating layer 372 is disposed between the semiconductor substrate 310 and the gate conductive layer 510, 520.

The semiconductor substrate may, e.g. comprise a base layer 305 of the first conductivity type and a first layer 306 of the first conductivity type.

Figure 5:
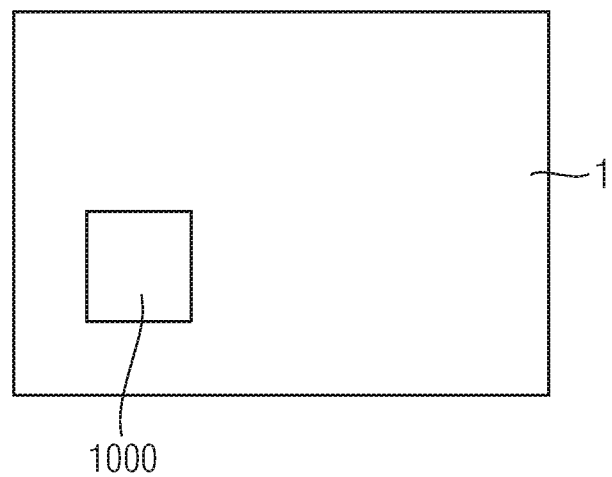
FIG. 5 schematically illustrates an electric device according to an embodiment.

FIG. 5 shows a schematic view of an electric device 1 according to an embodiment. The electric device comprises the semiconductor device 1000 which has been explained above. Among others, the electric device 1 may be a power MOSFET, a DC/DC converter or a power supply.

As has been explained above, due to the special layout of the semiconductor device comprising a first gate trench and a second gate trench and a mesa between the first gate trench and the second gate trench in the manner as has been discussed above, a termination region at the end of the first region of the mesa may be avoided since the mesa is implemented as a path so as to separate the first gate trench and the second gate trench. As a result, overcompensation in the termination region which might occur when the drift zone is depleted from three different directions may be avoided. At the same time, contacts to the gate electrode may be accomplished in an easy manner. In particular, the gate contacts may be disposed outside the transistor cell array 400. As a result, the contact area of the gate contacts may be increased without contacting an adjacent mesa. As a result, the feature sizes of the device, in particular, the pitch between the gate trenches may be further reduced without increasing problems of forming gate contacts. Further, due to the special structure of the end portion of the first sections, the field plate contacts may be widened so that contacts may be manufactured in a more simplified manner.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, comprising:
a first gate trench and a second gate trench in a first main surface of a semiconductor substrate, and a mesa arranged between the first gate trench and the second gate trench, the mesa separating the first gate trench from the second gate trench,
each of the first and second gate trenches comprising first sections extending in a first direction and second sections connecting adjacent ones of the first sections,
wherein the first sections of the first gate trench are interleaved with the first sections of the second gate trench,
wherein the second sections of the first gate trench are disposed opposite to the second sections of the second gate trench with respect to a plane perpendicular to the first direction.

2. The semiconductor device of claim 1, further comprising a plurality of vertical transistor cells arranged adjacent to the first sections of the first gate trench and the first sections of the second gate trench.

3. The semiconductor device of claim 2, wherein each of the plurality of vertical transistor cells comprises a source region arranged at the first main surface, a drain region arranged at a second main surface opposite the first main surface, and a gate electrode arranged in the first sections of the first gate trench or of the second gate trench.

4. The semiconductor device of claim 3, wherein the source regions of the vertical transistor cells are arranged adjacent to the first sections of the first and second gate trenches and are absent from the second sections.

5. The semiconductor device of claim 3, wherein each of the vertical transistor cells further comprises a field plate in the first or second gate trench disposed below the gate electrode.

6. The semiconductor device of claim 5, further comprising a plurality of field plate contacts disposed at an end portion of the first sections of the first and second gate trenches, the end portions of the first sections being arranged remote from the second sections, respectively.

7. The semiconductor device of claim 1, wherein the first sections of the first gate trench are disposed at a first pitch, wherein the first sections of the second gate trench are disposed at the first pitch, wherein sections of the mesa are disposed at a second pitch, and wherein the second pitch is equal to half the first pitch.

8. The semiconductor device of claim 1, further comprising gate contacts disposed outside a cell array defined by the first gate trench, the second gate trench and the mesa.

9. An electric device comprising the semiconductor device of claim 1.

10. The electric device of claim 9, wherein the electric device is a DC/DC converter.

11. A semiconductor device, comprising:
a first gate trench and a second gate trench in a first main surface of a semiconductor substrate, and a mesa arranged between the first gate trench and the second gate trench and separating the first gate trench from the second gate trench,
each of the first and second gate trenches comprising first sections extending in a first direction and second sections connecting adjacent ones of the first sections,
wherein the first sections of the first gate trench are disposed between adjacent ones of the first sections of the second gate trench, and the first sections of the second gate trench are disposed between adjacent ones of the first sections of the first gate trench.

12. The semiconductor device of claim 11, further comprising a plurality of vertical transistor cells arranged adjacent to the first sections of the first and second gate trenches.

13. The semiconductor device of claim 12, wherein vertical transistor cells are absent from the second sections of the first and second gate trenches.

14. The semiconductor device of claim 11, wherein the first sections of the first gate trench are disposed at a first pitch, wherein the first sections of the second gate trench are disposed at the first pitch, wherein sections of the mesa are disposed at a second pitch, and wherein the second pitch is equal to half the first pitch.

15. The semiconductor device of claim 11, further comprising gate contacts disposed outside a cell array defined by the first gate trench, the second gate trench and the mesa.

16. The semiconductor device of claim 11, further comprising a plurality of field plate contacts disposed at an end portion of the first sections of the first and second gate trenches, the end portions of the first sections being arranged remote from the second sections of a corresponding one of the first and second gate trenches.

17. A semiconductor device, comprising:
a first gate trench and a second gate trench in a first main surface of a semiconductor substrate, and a mesa arranged between the first gate trench and the second gate trench and separating the first gate trench from the second gate trench,
wherein the mesa comprises first regions extending in a first direction and second regions connecting adjacent ones of the first regions, the mesa being implemented as a path.

18. The semiconductor device of claim 17, further comprising a plurality of vertical transistor cells arranged in the first regions.

19. The semiconductor device of claim 18, wherein each of the plurality of vertical transistor cells comprises a source region arranged at the first main surface, a drain region arranged at a second main surface opposite the first main surface, and a gate electrode arranged in the first gate trench or in the second gate trench.

20. The semiconductor device of claim 19, wherein the source regions of the vertical transistor cells are arranged in the first regions and are absent from the second regions.

* * * * *